(12) United States Patent
Kang

(10) Patent No.: US 7,990,784 B2
(45) Date of Patent: Aug. 2, 2011

(54) CLOCK SIGNAL GENERATING CIRCUIT AND DATA OUTPUT APPARATUS USING THE SAME

(75) Inventor: Tae Jin Kang, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 562 days.

(21) Appl. No.: 12/156,859

(22) Filed: Jun. 5, 2008

(65) Prior Publication Data

US 2009/0154267 A1 Jun. 18, 2009

(30) Foreign Application Priority Data

Dec. 14, 2007 (KR) ........................ 10-2007-0131313

(51) Int. Cl.
*G11C 17/00* (2006.01)

(52) U.S. Cl. ...................... 365/194; 365/233.1

(58) Field of Classification Search .................. 365/194, 365/233.1, 233.12; 327/291; 711/104
See application file for complete search history.

(56) References Cited

U.S. PATENT DOCUMENTS

| | | | |
|---|---|---|---|
| 2002/0105838 A1 | 8/2002 | Maruyama et al. | |
| 2002/0144170 A1* | 10/2002 | Mullarkey | 713/401 |
| 2002/0176292 A1* | 11/2002 | Akasaki et al. | 365/200 |
| 2002/0178322 A1* | 11/2002 | Gans et al. | 711/104 |
| 2007/0146039 A1* | 6/2007 | Koo | 327/291 |
| 2008/0001638 A1 | 1/2008 | Choi | |

FOREIGN PATENT DOCUMENTS

| KR | 10-0638747 | 7/2006 |
|---|---|---|
| KR | 10-0753036 | 4/2007 |

* cited by examiner

*Primary Examiner* — Vu A Le

(74) *Attorney, Agent, or Firm* — John P. White; Cooper & Dunham LLP

(57) ABSTRACT

A semiconductor memory device having a clock signal generating circuit which is capable of controlling a data output in compliance with PVT fluctuation by controlling a output timing of rising and falling clock signal based on a fuse cutting is described. The clock signal generating circuit includes a fuse unit for generating first and second fuse signals based on fuse cutting of fuses, a control signal generating unit for generating first and second fuse signals in response to the fuse signals, a clock signal delaying unit for generating a delayed clock signal by delaying the external clock signal by a delay section specified by the control signals, and a clock generating unit for generating a first internal clock signal in synchronization with a rising edge of the delayed clock signal and for generating a second internal clock signal in synchronization with a falling edge of the delayed clock signal.

19 Claims, 8 Drawing Sheets data output section

CLOCK SIGNAL GENERATING CIRCUIT AND DATA OUTPUT APPARATUS USING THE SAME

TECHNICAL FIELD

The present disclosure relates to a data output apparatus and, more particularly, to a clock signal generating circuit capable of controlling data output timing based on a fuse cutting.

BACKGROUND

Recently, the main issue of semiconductor memory devices is shifted from a degree of integration to an operating speed. Accordingly, high-speed synchronous DRAMs such as a DDR SDRAM (Double Data Rate Synchronous DRAM) and a RAMBUS DRAM are focused on high-speed data processing units.

The high-speed synchronous DRAMs are memory devices in which data are processed in synchronization with an external clock signal and this operation mechanism is a mainstream approach in the mass production of DRAM devices. The accesses for data input/output operation of the SDRAMs are carried out periodically in synchronization with a rising edge of an external clock signal. However, in the DDR SDRAM, the data input/output operation are periodically carried out twice in synchronization with rising and falling edges, respectively, of the external clock signal using an internal DLL (Delay Locked Loop) circuit. That is, the DDR SDRAM is twice as fast as the SDRAM. Therefore, a high-speed semiconductor memory device such as the DDR SDRAM produces a clock signal (hereinafter, referred to as "rising clock signal rclk") which is enabled in response to a rising edge time of the external clock signal and another clock signal (hereinafter, referred to as "falling clock signal fclk") which is enabled in response to a falling edge time of the external clock signal.

FIG. 1 is a circuit diagram illustrating a clock signal generating circuit by the conventional technology.

Referring to FIG. 1, the clock signal generating circuit of a conventional DDR SDRAM includes first and second clock signal generators 100 and 110. The first clock signal generator 100 includes a pair of inverters IV11 and IV12 for buffering an external clock signal ECLK, a delayer 101 for delaying an output signal of a node nd11 for a predetermine time, an inverter IV13 for inverting an output signal of the delayer 101, a logic circuit having a NAND gate ND11 for performing a NAND operation of the output signal of the node nd11 and an output signal of the inverter IV13, and an inverter IV14. The second clock signal generator 110 includes a transfer gate T11 for transferring the external clock signal ECLK, an inverter IV15 for inverting an output signal of the transfer gate T11, a delayer 111 for delaying an output signal of a node nd12 for a predetermine time, an inverter IV16 for inverting an output signal of the delayer 111, and a logic circuit having a NAND gate ND12 for performing a NAND operation of the output signal of the node nd12 and an output signal of the inverter IV16, and an inverter IV17

This configured clock signal generating circuit produces both a rising clock signal rclk having a predetermined pulse width in synchronization with a rising edge of the external clock signal ECLK and a falling clock signal fclk having a predetermined pulse width in synchronization with a falling edge of the external clock signal ECLK. At a read operation, data are outputted in synchronization with the rising clock signal rclk as well as the falling clock signal fclk.

However, the rising and falling clock signals rclk and fclk of the conventional clock signal generating circuit can be outputted faster or later under the influence of PVT (Process, Voltage and Temperature) fluctuation. For instance, as shown in FIG. 2, in a case that a MOS transistor has a fast operating characteristic according to a manufacturing process, data which are issued in synchronization with the rising and falling clock signal rclk and fclk can be outputted faster than a predetermined data output section (more particularly, second rising edge of the external clock signal ECLK).

SUMMARY

The present disclosure is directed to providing a semiconductor memory device having a clock signal generating circuit which is capable of controlling a data output in compliance with PVT fluctuation by controlling an output timing of rising and falling clock signal based on fuse cutting.

According to an aspect of the present disclosure, there is provided a semiconductor memory device having a clock signal generating circuit to generate an internal clock signal using an external clock signal from an external circuit, the clock signal generating circuit comprising a fuse unit for generating first and second fuse signals based on fuse cutting of fuses, a control signal generating unit for generating first and second control signals in response to the fuse signals, a clock signal delaying unit for generating a delayed clock signal by delaying the external clock signal by a delay section in accordance with the control signals, and a clock generating unit for generating a first internal clock signal in synchronization with a rising edge of the delayed clock signal and for generating a second internal clock signal in synchronization with a falling edge of the delayed clock signal.

The fuse unit includes a pull-up device coupled between a power supply terminal and a first node for performing a pull-up operation in response to a ground voltage level, a first fuse coupled to the first node for generating the first fuse signal, and a second fuse coupled to the first node for generating the second fuse signal.

The control signal generating unit includes a first control signal generating unit including a first latch unit to perform a latch operation in response to the first fuse signal and a first buffer to buffer an output signal of the first latch unit, and a second control signal generating unit including a second latch unit to perform a latch operation in response to the second fuse signal and a second buffer to buffer an output signal of the second latch unit.

The first control signal generating unit has a pull-down element for performing a pull-down operation at an input terminal of the first control signal generating unit in response to a reset signal.

The first latch unit includes an inverter for inverting a signal on an input terminal of the first control signal generating unit, and a pull-down element for performing a pull-down operation at the input terminal of the first control signal generating unit in response to an output signal of the inverter.

The second control signal generating unit has a pull-down element for performing a pull-down operation at an input terminal of the second control signal generating unit in response to a reset signal.

The second latch unit includes an inverter for inverting a signal on an input terminal of the second control signal generating unit, and a pull-down element for performing a pull-down operation at the input terminal of the second control signal generating unit in response to an output signal of the inverter.

The clock signal delaying unit includes a first delayer for delaying the external clock signal by a first section in response to the first and second control signals, a second delayer for delaying the external clock signal by a second section in response to the first control signal, and a logic unit for performing a logic operation of output signals of the first and second delayers.

The first delayer includes a first logic unit for performing a logic operation of the first and second control signals, and a second logic unit for delaying the external clock signal in response to an output signal of the first logic unit The second delayer includes a delay element for delaying the external clock signal, and a buffer for buffering an output signal of the delay element in response to the first control signal.

The clock generating unit includes a first internal clock generating unit for generating the first internal clock signal with a first pulse width in synchronization with the rising edge of the delayed clock signal, and a second internal clock generating unit for generating the second internal clock signal with a second pulse width in synchronization with the falling edge of the delayed clock signal.

The first internal clock generating unit includes a buffer for buffering the delayed clock signal, a delay element for delaying an output signal of the buffer by the first pulse width, and a logic unit for performing a logic operation of the output signal of the buffer and an output signal of the delay element.

The first internal clock generating unit includes a transfer gate for transferring the delayed clock signal, a buffer for inverting an output signal of the transfer gate, a delay element for delaying an output signal of the buffer, and a logic unit for performing a logic operation of the output signal of the buffer and an output signal of the delay element.

According to another aspect of the present disclosure, there is provided a semiconductor memory device having a data output apparatus to output data in synchronization with internal clock signals, the data output apparatus comprising a clock signal generating circuit for generating the internal clock signals using an external clock signal, a data latch for synchronizing the data from a memory core with the internal clock signals, and an output driver for driving the data latch to output the data to a DQ pad.

The clock signal generating circuit includes a fuse unit for generating first and second fuse signals based on fuse cutting of fuses, a control signal generating unit for generating first and second control signals in response to the fuse signals, a clock signal delaying unit for generating a delayed clock signal by delaying the external clock signal by a delay section specified by the control signals, and a clock generating unit for generating a first internal clock signal in synchronization with a rising edge of the delayed clock signal and for generating a second internal clock signal in synchronization with a falling edge of the delayed clock signal.

The fuse unit includes a pull-up device coupled between a power supply terminal and a first node for performing a pull-up operation in response to a ground voltage level, a first fuse coupled to the first node for generating the first fuse signal, and a second fuse coupled to the first node for generating the second fuse signal.

The control signal generating unit includes a first control signal generating unit for generating the first control signal, having a first latch unit to perform a latch operation in response to the first fuse signal and a first buffer to buffer an output signal of the first latch unit, and a second control signal generating unit for generating the second control signal, having a second latch unit to perform a latch operation in response to the second fuse signal and a second buffer to buffer an output signal of the second latch unit.

The clock signal delaying unit includes a first delayer for delaying the external clock signal by a first section in response to the first and second control signals, a second delayer for delaying the external clock signal by a second section in response to the first control signal, and a logic unit for performing a logic operation of output signals of the first and second delayers.

The first delayer includes a first logic unit for performing a logic operation of the first and second control signal, and a second logic unit for delaying the external clock signal in response to an output signal of the first logic unit.

The second delayer includes a delay element for delaying the external clock signal, and a buffer for buffering an output signal of the delay element in response to the first control signal.

The clock generating unit includes a first internal clock generating unit for generating a first internal clock signal with a first pulse width in synchronization with the rising edge of the delayed clock signal, and a second internal clock generating unit for generating a second internal clock signal with a second pulse width in synchronization with the falling edge of the delayed clock signal.

BRIEF DESCRIPTION OF THE DRAWINGS

The above and other aspects, features and other advantages of the subject matter of the present disclosure can be more clearly understood from the following detailed description taken in conjunction with the accompanying drawings, in which.

DETAILED DESCRIPTION OF THE PREFERRED EMBODIMENTS

Hereinafter, the present invention will be described in detail through examples and exemplary embodiments. The examples and exemplary embodiments merely exemplify the present invention, and the scope of the present disclosure and the appended claims is not limited by them.

Figure 1:
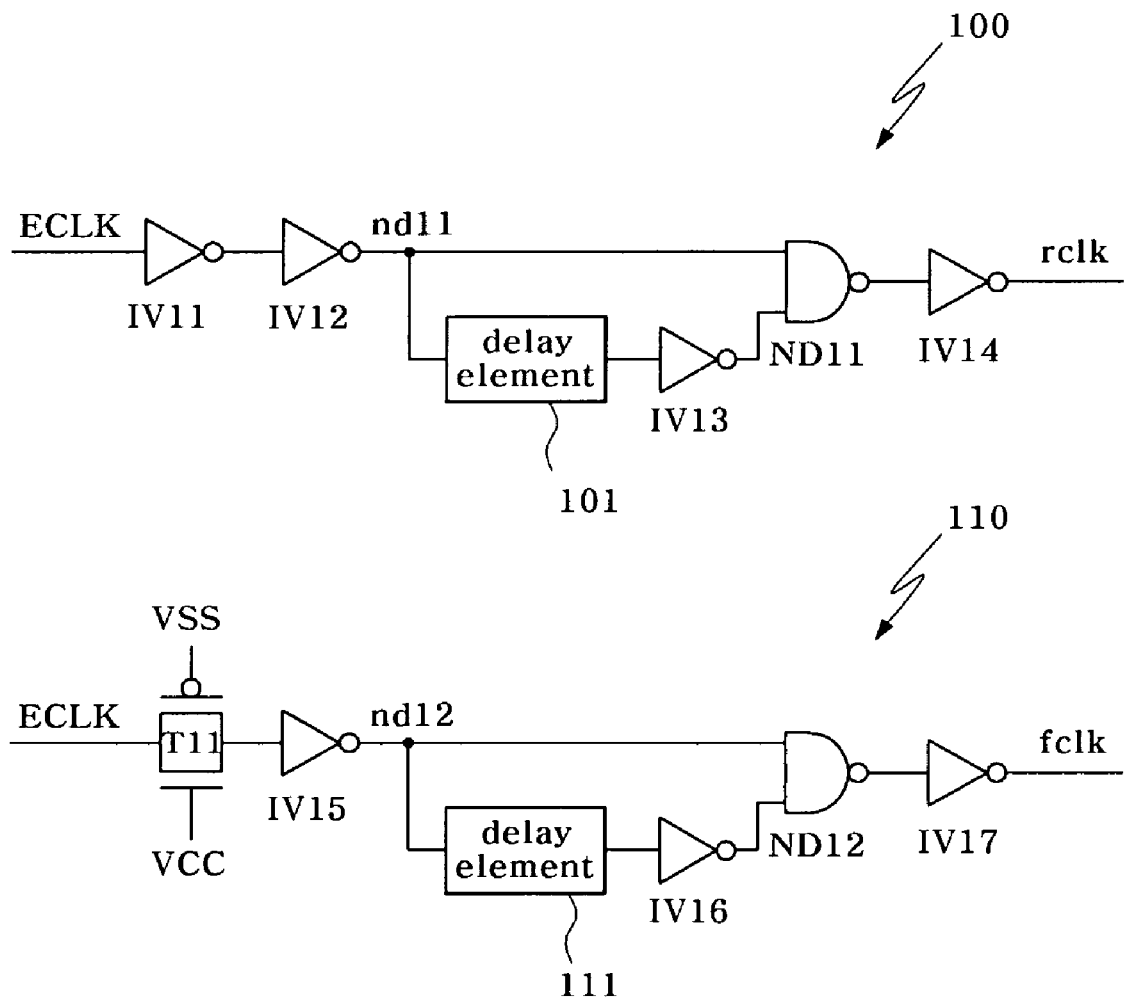
FIG. 1 is a circuit diagram illustrating a clock signal generating circuit of a conventional DDR SDRAM.
Figure 2:
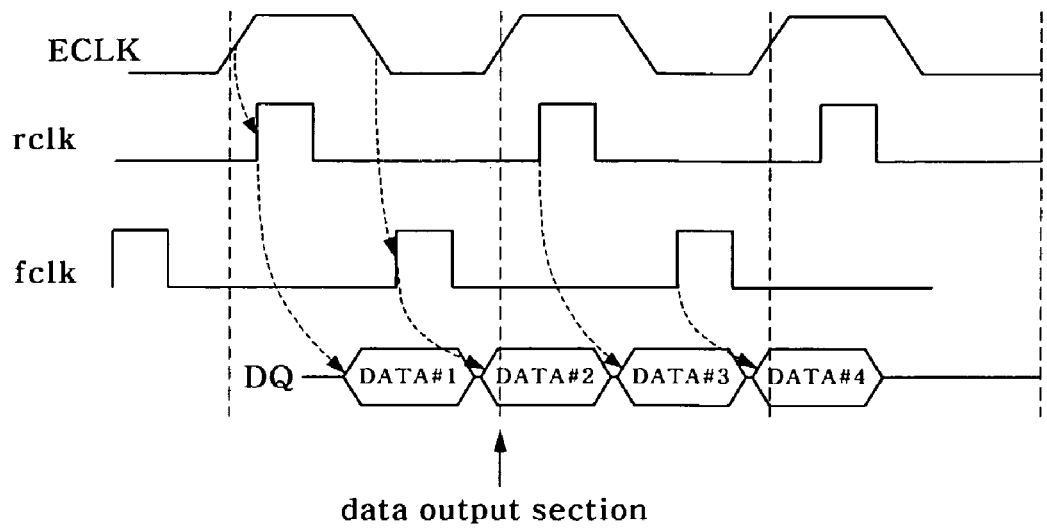
FIG. 2 is a timing chart illustrating an operation of the clock signal generating circuit in FIG. 1.
Figure 3:
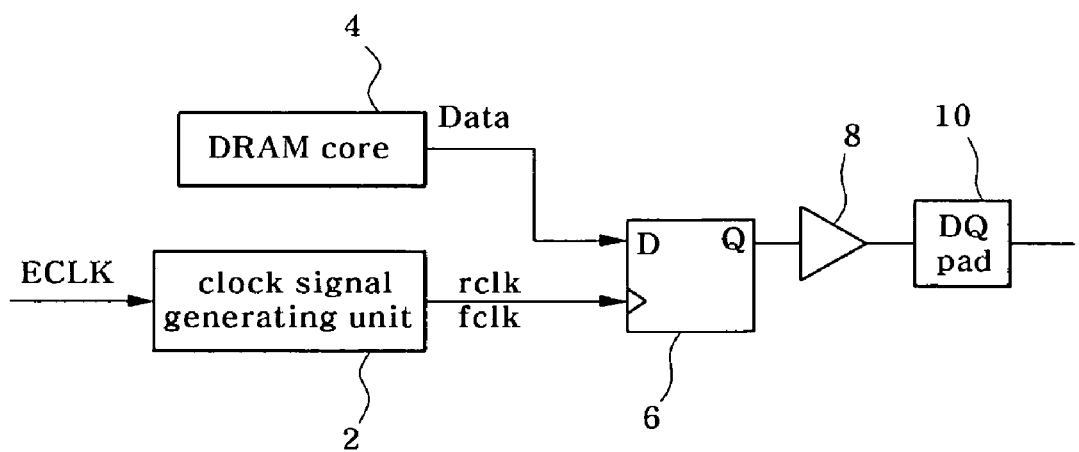
FIG. 3 is a schematic diagram illustrating a data output apparatus according to an specific embodiment of the present invention.

First, referring to FIG. 3, a data output apparatus according to the present invention includes a clock signal generating unit 2, a DRAM core 4, a data latch unit 6, a driver 8 and a DQ pad 10.

The clock signal generating unit 2 produces rising and falling clock signals rclk and fclk, which have a predetermined pulse width, in synchronization with rising and falling edges of an external clock signal ECLK. At this time, the rising and falling clock signals rclk and fclk are timing controlled based on fuse cutting.

Figure 4:
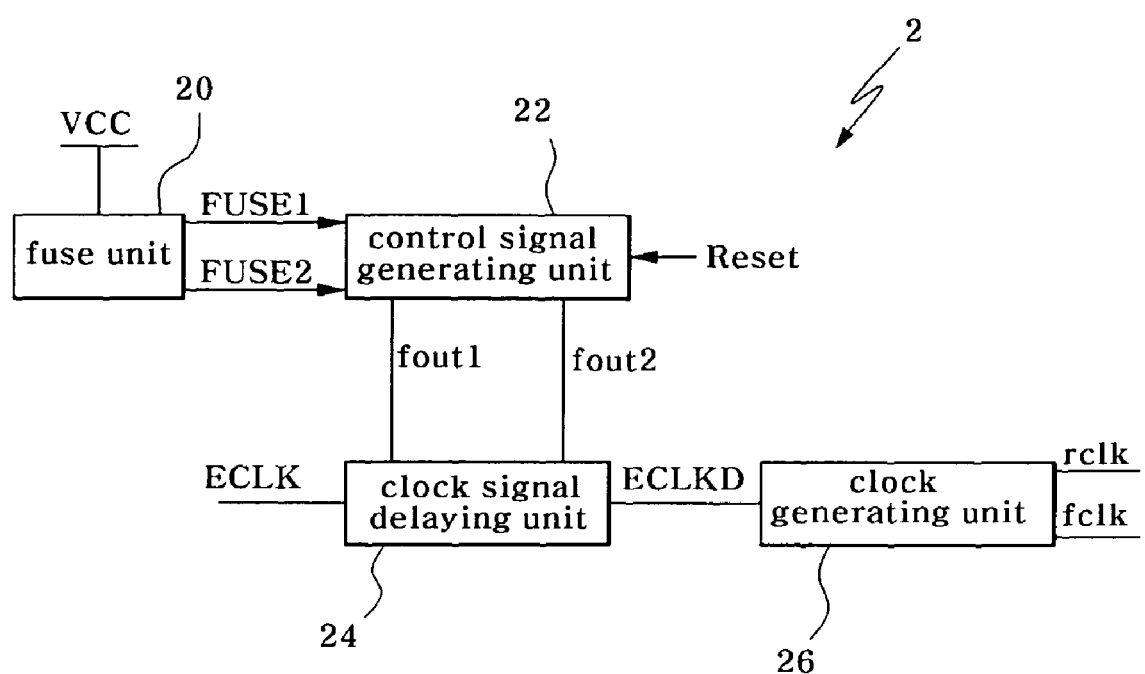
FIG. 4 is a circuit diagram illustrating a clock signal generating circuit included in the data output apparatus in FIG. 3.

More concretely, referring to FIG. 4, the clock signal generating unit 2 according to the exemplary embodiment of FIG. 4 includes a fuse unit 20, a control signal generating unit 22, a clock signal delaying unit 24 and a clock generating unit 26.

Figure 5:
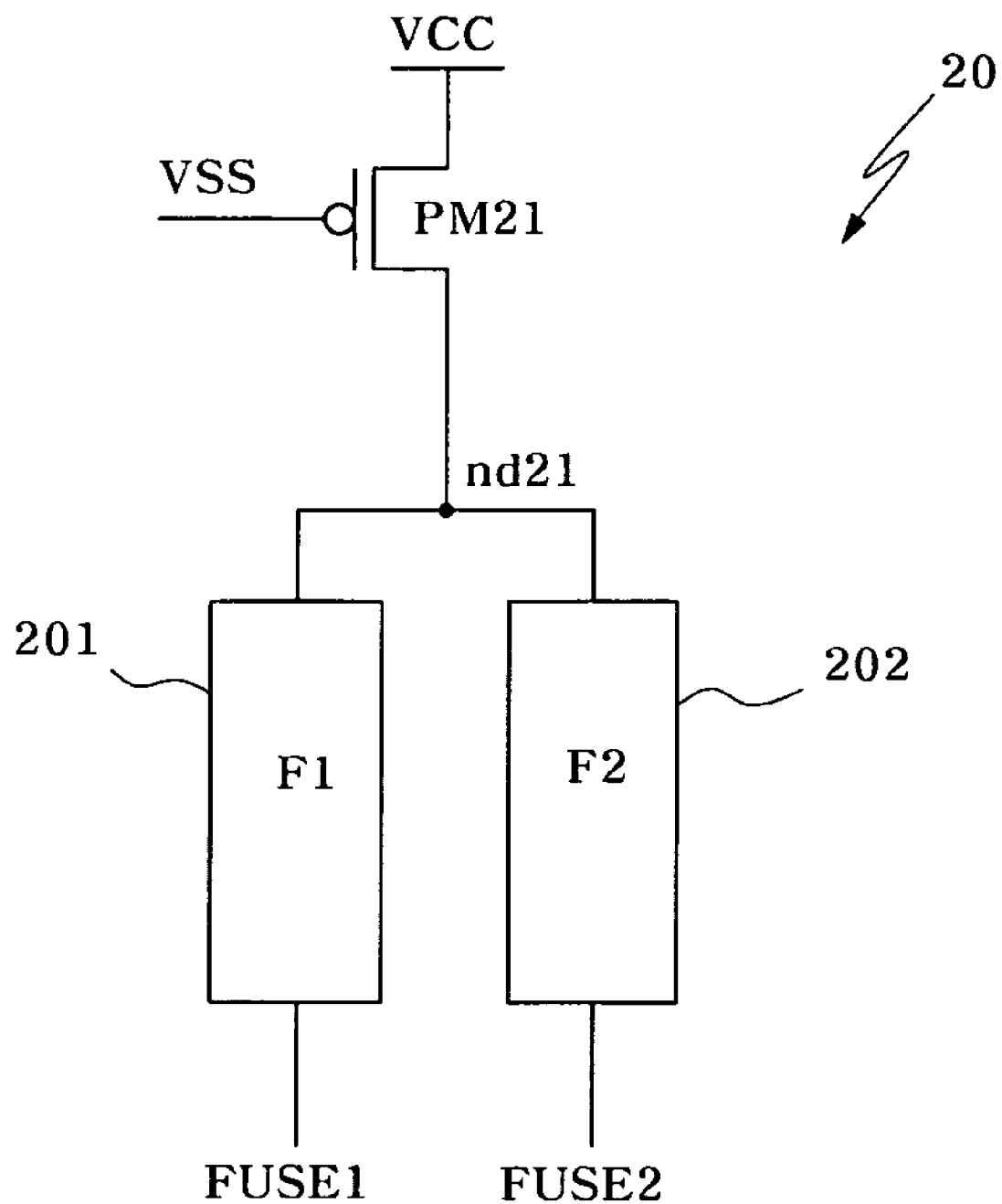
FIG. 5 is a circuit diagram illustrating a fuse unit included in clock signal generating circuit of FIG. 4.

The fuse unit 20, as shown in FIG. 5, includes a PMOS transistor PM21 for performing a pull-up operation at a node nd21, a first fuse F1 connected to the node nd21 for generating a first fuse signal FUSE1 and a second fuse F2 connected to the node nd21 for generating a second fuse signal FUSE2. At this time, the fuse is made of a conducting layer such as a polysilicon layer, aluminum layer or a tungsten layer.

Figure 6:
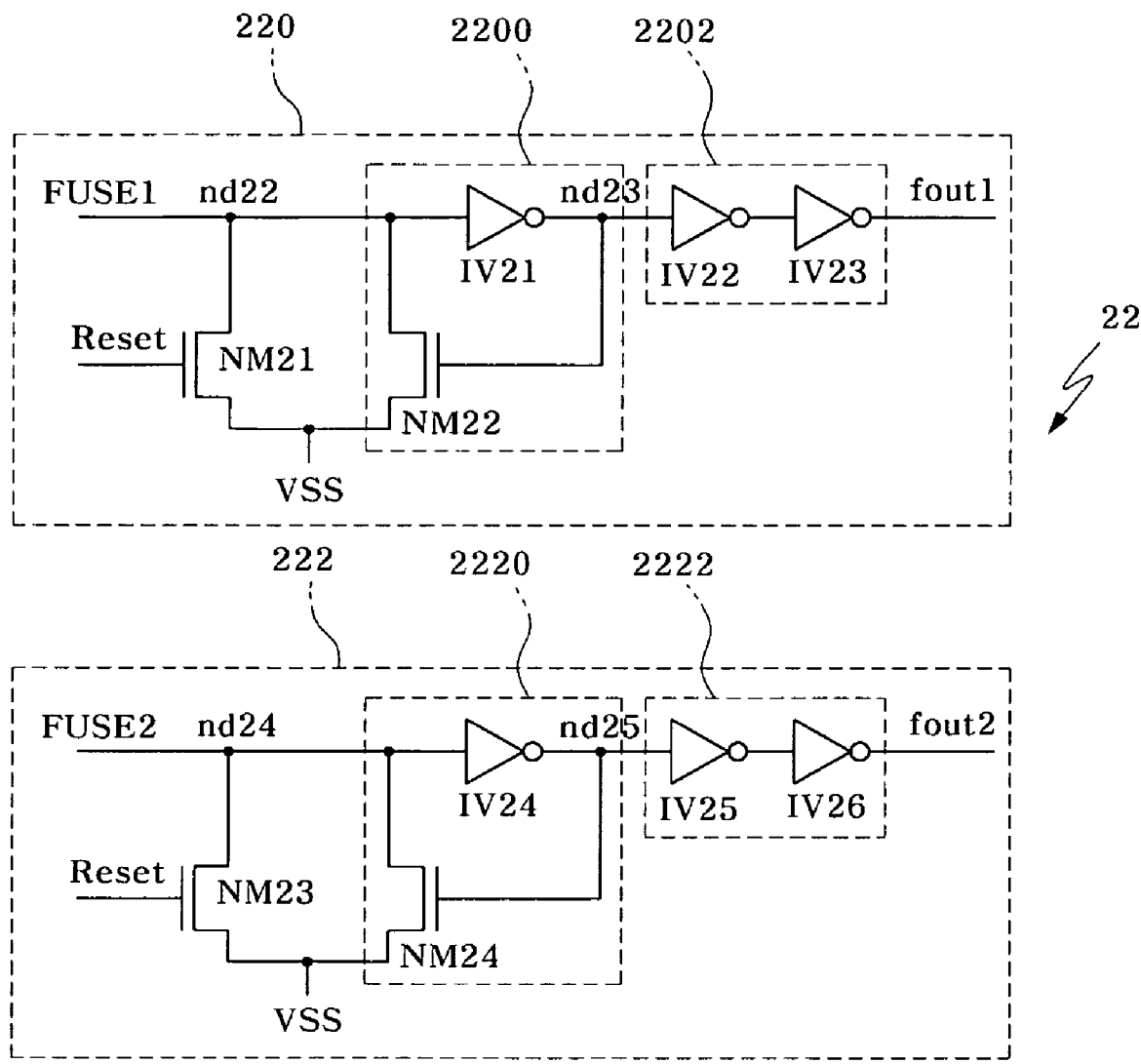
FIG. 6 is a circuit diagram illustrating a control signal generating unit included in the clock signal generating circuit of FIG. 4.

Referring to FIG. 6, the control signal generating unit 22 includes a first control signal generating unit 220 for generating a first control signal fout1 in response to the first fuse signal FUSE1 and a second control signal generating unit 222 for generating a second control signal fout2 in response to the second fuse signal FUSE2.

The first control signal generating unit 220 includes an NMOS transistor NM21 for performing a pull-down operation at a node nd22 in response to a reset signal Reset, a latch unit 2200 having an inverter IV21 and an NMOS transistor NM22 in order to perform a latch operation in response to an output signal from the node nd22, and a buffer (two inverters IV22 and IV23) for buffering an output signal of the latch unit 2200. Here, the reset signal Reset is a signal which is transited from a high voltage level to a low voltage level after a power supply voltage VCC goes to a predetermined voltage level.

The second control signal generating unit 222 includes an NMOS transistor NM23 for performing a pull-down operation at a node nd24 in response to the reset signal Reset, a latch unit 2220 having an inverter IV24 and an NMOS transistor NM24 in order to perform a latch operation in response to an output signal from the node nd24, and a buffer (two inverters IV25 and IV26) for buffering an output signal of the latch unit 2220.

Figure 7:
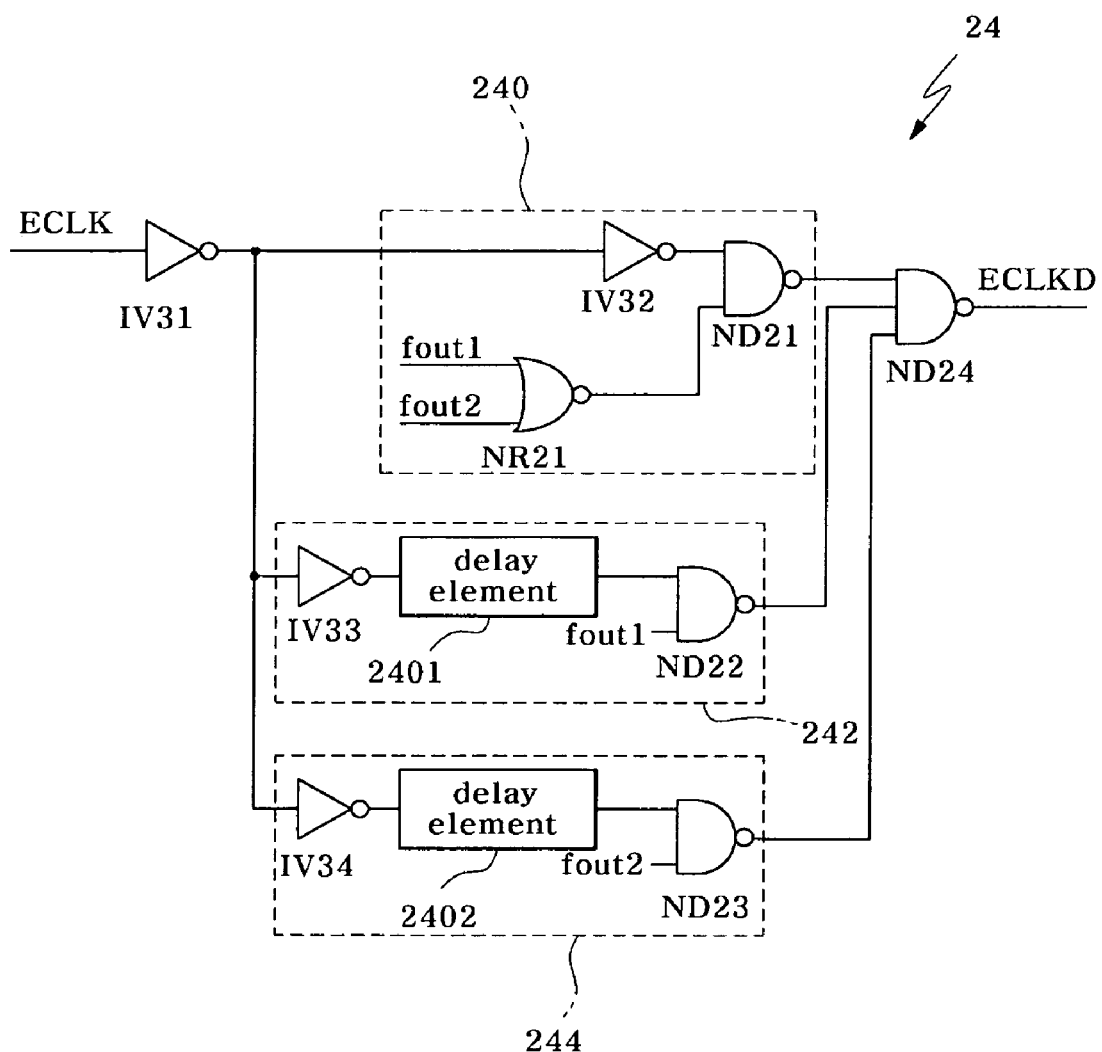
FIG. 7 is a circuit diagram illustrating a clock signal delaying unit included in the clock signal generating circuit of FIG. 4.

The clock signal delaying unit 24, as shown in FIG. 7, includes a first delayer 240 for delaying the external clock signal ECLK for a predetermined time in response to the first and second control signals fout1 and fout2, a second delayer 242 for delaying the external clock signal ECLK for a predetermined time in response to the first control signal fout1, a third delayer 244 for delaying the external clock signal ECLK for a predetermined time in response to the second control signal fout2, and a NAND gate ND24 configured to receive output signals of the first to third delayers 240 to 244 and generate a delayed clock signal ECLKD by performing an OR operation of the received output signals.

The first delayer 240 includes a NOR gate NR21 for NORing the first and second control signals fout1 and fout2, an inverter IV32 for inverting an inverted signal of the external clock signal ECLK, and a NAND gate ND21 for NANDing output signals of the NOR gate NOR21 and the inverter IV32.

The second delayer 242 includes an inverter IV33 for inverting the inverted signal of the external clock signal ECLK, a delay element 2401 for delaying an output signal of the inverter IV33 for a predetermined time, and a NAND gate ND22 for NANDing an output signal of the delay element 2401 and the first control signal fout1.

The third delayer 244 includes an inverter IV34 for inverting the inverted signal of the external clock signal ECLK, a delay element 2402 for delaying an output signal of the inverter IV34 for a predetermined time, and a NAND gate ND23 for NANDing an output signal of the delay element 2402 and the second control signal fout2. Preferably, the delay time which is taken by the delay element 2402 of the third delayer 244 is longer than that which is taken by the delay element 2401 of the second delayer 242.

Figure 8:
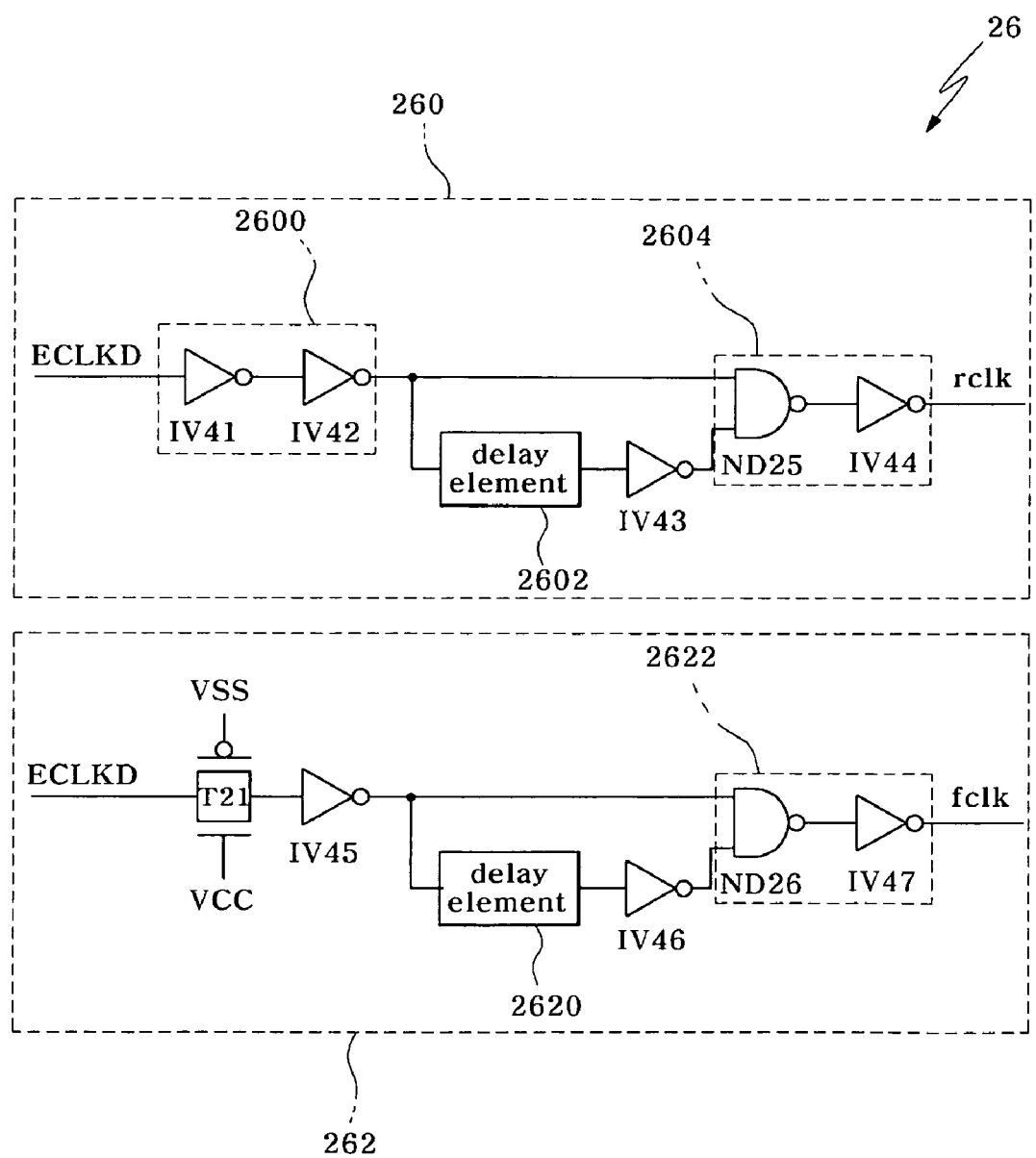
FIG. 8 is a circuit diagram illustrating a clock generating unit included in the clock signal generating circuit of FIG. 4.

Referring to FIG. 8, the clock generating unit 26 includes a rising clock signal generating unit 260 and a falling clock signal generating unit 262.

The rising clock signal generating unit 260 includes a buffer 2600 for buffering the delayed clock signal ECLKD, a delay element 2602 for delaying an output signal of the buffer 2600 for a predetermined time, an inverter IV43 for inverting an output signal of the delay element 2602, and a logic unit 2604 for ANDing the output signal of the buffer 2600 and an output signal of the inverter IV43.

The falling clock signal generating unit 262 includes a transfer gate T21 for transferring the delayed clock signal ECLKD, an inverter IV45 for inverting an output signal of the transfer gate T21, a delay element 2620 for delaying an output signal of the inverter IV45 for a predetermined time, an inverter IV46 for inverting an output signal of the delay element 2620, and a logic unit 2622 for ANDing the output signals of the inverter IV46 and the inverter IV45.

The data latch unit 6 outputs the data, which are outputted from the DRAM core 4, in synchronization with the rising clock signal rclk and the falling clock signal fclk.

The driver 8 drives the data latch 6 to output the data through the DQ pad 10.

In the data output apparatus according to the exemplary embodiment of the present invention, the clock signal generating unit 2 produces the rising clock signal rclk and the falling clock signal fclk using the received external clock signal ECLK. At this time, the timing of the rising clock signal rclk and the falling clock signal fclk is controlled based on the fuse cutting.

More concretely, the fuse unit 20 produces the first fuse signal FUSE1 and the second fuse signal FUSE2 based on the cutting of the first fuse F1 and the second fuse F2. For, example, in a case that all of the first fuse F1 and the second fuse F2 are not cut, the first and second fuse signals FUSE1 and FUSE2 are generated at a high level. In a case that only the first fuse F1 is cut, the first fuse signal FUSE1 is generated at a low level and, in a case that only the second fuse F2 is cut, the second fuse signal FUSE2 is generated at a low level. At this time, it should be noted that the fuse cutting is set up so as not to cut all of the first fuse F1 and the second fuse F2.

The control signal generating unit 22 produces the first control signal fout1 and the second control signal fout2 using the received first and second fuse signals FUSE1 and FUSE2. At this time, the voltage levels on the nodes nd22 and nd24 are initialized by the reset signal Reset so that the power supply voltage VCC goes to a predetermined voltage level and the nodes nd22 and nd24 are at a low voltage level.

After the nodes nd22 and nd24 are at a predetermined low voltage level, the first control signal fout1 and the second control signal fout2 which are respectively generated in response to the first and second fuse signals FUSE1 and FUSE2 that are generated by the fuse cutting of the first and second fuse F1 and F2 in the fuse unit 20 are shown in Table 1 below.

TABLE 1

| F1 | F2 | FUSE1 | FUSE2 | fout1 | fout2 |
|---|---|---|---|---|---|
| no cut | no cut | H | H | L | L |
| cut | no cut | L | H | H | L |
| no cut | cut | H | L | L | H |
| cut | cut | L | L | no used | |

The clock signal delaying unit 24 produces the delayed clock signal ECLKD by delaying the external clock signal ECLK based on the combination of the first and second control signals fout1 and fout2. That is, in a case that the first and second fuses F1 and F2 are not cut, the NOR gate NR21 outputs a high level signal and the NAND gates ND22 and ND23 output a high level signal because the first and second control signal fout1 and fout2 are generated at a low level. As a result, the NAND gates ND21 and ND24 serve as inverters. Accordingly, the external clock signal ECLK, which is delayed by the inverters IV31 and IV32 and the NAND gates ND21 and ND24, is outputted as the delayed clock signal ECLKD.

In a case that only the first fuse F1 is cut, the NAND gates ND21 and ND23 output high level signals because the first control signal fout1 is generated at a high level and the second control signal fout2 is generated at a low level. As a result, the NAND gates ND22 and ND24 serve as inverters. Accordingly, the external clock signal ECLK, which is delayed by the inverters IV31 and IV33, the delay element 2401 and the NAND gates ND22 and ND24, is outputted as the delayed clock signal ECLKD.

Similarly, in a case that only the second fuse F2 is cut, the external clock signal ECLK, which is delayed by the inverters IV31 and IV34, the delay element 2402 and the NAND gates ND23 and ND24, is outputted as the delayed clock signal ECLKD.

As mentioned above, the clock signal generating circuit 2 according to the exemplary embodiment of the present invention outputs the delayed clock signal ECLKD by delaying the external clock signal ECLK through different delay sections based on the fuse cutting of the fuse F1 and F2. At this time, since the delay time of the delay element 2402 included in the third delayer 244 is longer than that of the delay element 2401 included in the second delayer 242 and the delay time of the delay element 2401 included in the second delayer 242 is longer than that of the inverter IV32 included in the first delayer 240, the delayed clock signal ECLKD has the smallest amount of delay when all of the first and second fuses F1 and F2 are not cut and has the largest amount of delay when only the second fuse F2 is cut.

The clock generating unit 26 produces the rising clock signal rclk and the falling clock signal fclk using the delayed clock signal ECLKD. At this time, the pulse width of the rising clock signal rclk and the falling clock signal fclk can be determined based on the delay amount of the delay elements 2602 and 2620.

The data latch 6 outputs the data from the DRAM core 4 in synchronization with the rising clock signal rclk and the falling clock signal fclk and the driver 8 drives the data latch 6 to output the data through the DQ pad 10.

The data output apparatus according to the exemplary embodiment of the present invention produces a delayed clock signal ECLKD, a delay amount of which is controlled based on the fuse cutting such that the data output timing is controlled by the rising clock signal rclk and the falling clock signal fclk which are generated based on the delay controlled clock signal ECLKD.

Figure 9:
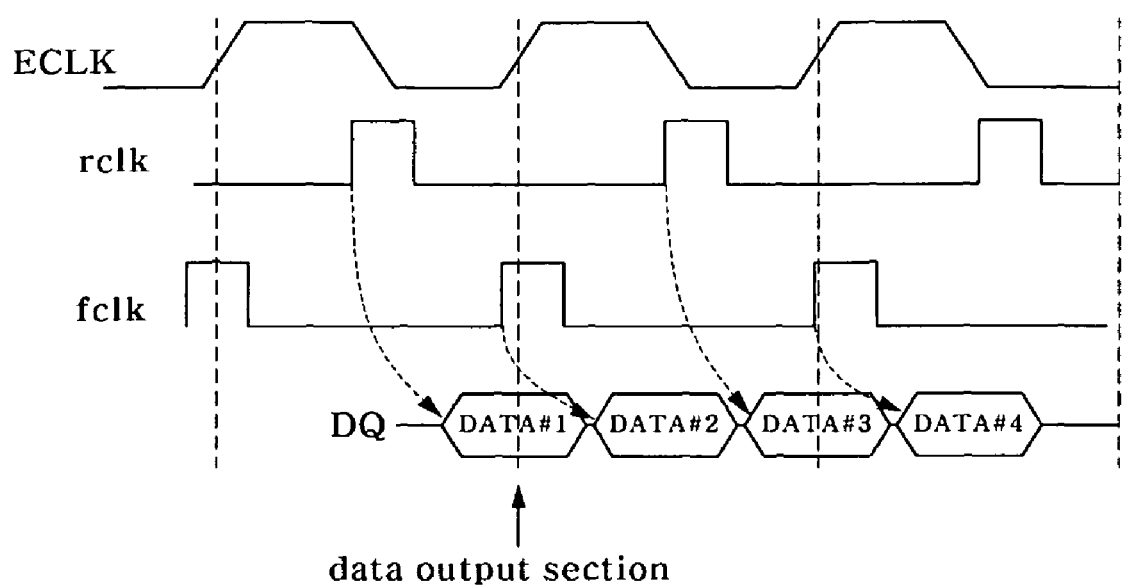
FIG. 9 is a timing chart illustrating an operation of the clock signal generating circuit of FIG. 4.

A timing of the rising clock signal rclk and the falling clock signal fclk, each of which has a predetermined delay section, and a timing of the data output section (second rising edge of the external clock signal ECLK) through the DQ pad 10 are shown in FIG. 9.

In the present invention, the electrical characteristics of MOS transistors, which are included in the clock signal generating unit for generating the rising clock signal rclk and the falling clock signal fclk, are of typical process and the fuse cutting is set up so as not to cut all of the first fuse F1 and the second fuse F2.

Accordingly, when the first fuse F1 is cut, the timing of the rising clock signal rclk and the falling clock signal fclk can be delayed by the delayed external clock signal ECLKD which is generated through the second delayer 242, a delay time of which is longer than that of the first delayer 240.

At this time, in a case that the rising clock signal rclk and the falling clock signal fclk are fast in spite of the fuse cutting of first fuse F1, the timing of the rising clock signal rclk and falling clock signal fclk can be delayed by using the delayed external clock signal ECLKD which is generated by the third delayer 244.

As apparent from the above, the clock signal generating unit according to the present invention can control the data output timing based on the PVT fluctuation by controlling the timing of the rising clock signal rclk and the falling clock signal fclk using fuse cutting.

While the present invention has been described with respect to examples and exemplary embodiments, it will be apparent to those skilled in the art that various changes and modifications may be made without departing from the spirit and scope of this disclosure and the following claims.

This disclosure claims priority to Korean application number 10-2007-0131313, filed on Dec. 14, 2007, the entire contents of which are incorporated herein by reference.

What is claimed is:

1. A semiconductor memory device comprising:
 a fuse unit for generating fuse signals based on fuse cutting of fuses;
 a control signal generating unit for generating control signals in response to the fuse signals;
 a clock signal delaying unit for generating a delayed clock signal by delaying the external clock signal by a delay section in accordance with the control signals;
 a first internal clock generating unit configured to generate a first internal clock signal with a first pulse width in synchronization with the rising edge of the delayed clock signal; and
 a second internal clock generating unit configured to generate a second internal clock signal with a second pulse width in synchronization with the falling edge of the delayed clock signal.

2. The semiconductor memory device of claim 1, wherein the fuse unit includes:
 a pull-up device coupled between a power supply terminal and a first node for performing a pull-up operation in response to a ground voltage level;
 a first fuse coupled to the first node for generating the first fuse signal; and
 a second fuse coupled to the first node for generating the second fuse signal.

3. The semiconductor memory device of claim 2, wherein the control signal generating unit includes:

a first control signal generating unit including a first latch unit to perform a latch operation in response to the first fuse signal and a first buffer to buffer an output signal of the first latch unit; and a second control signal generating unit including a second latch unit to perform a latch operation in response to the second fuse signal and a second buffer to buffer an output signal of the second latch unit.

4. The semiconductor memory device of claim 3, wherein the first control signal generating unit has a pull-down element for performing a pull-down operation at an input terminal of the first control signal generating unit in response to a reset signal.

5. The semiconductor memory device of claim 3, wherein the first latch unit includes:

an inverter for inverting a signal on an input terminal of the first control signal generating unit; and a pull-down element for performing a pull-down operation at the input terminal of the first control signal generating unit in response to an output signal of the inverter.

6. The semiconductor memory device of claim 4, wherein the second control signal generating unit has a pull-down element for performing a pull-down operation at an input terminal of the second control signal generating unit in response to a reset signal.

7. The semiconductor memory device of claim 3, wherein the second latch unit includes:

an inverter for inverting a signal on an input terminal of the second control signal generating unit; and a pull-down element for performing a pull-down operation at the input terminal of the second control signal generating unit in response to an output signal of the inverter.

8. The semiconductor memory device of claim 3, wherein the clock signal delaying unit includes:

a first delayer for delaying the external clock signal by a first section in response to the first and second control signals;

a second delayer for delaying the external clock signal by a second section in response to the first control signal; and a logic unit for performing a logic operation of output signals of the first and second delayers.

9. The semiconductor memory device of claim 8, wherein the first delayer includes:

a first logic unit for performing a logic operation of the first and second control signal; and a second logic unit for delaying the external clock signal in response to an output signal of the first logic unit.

10. The semiconductor memory device of claim 8, wherein the second delayer includes:

a delay element for delaying the external clock signal; and a buffer for buffering an output signal of the delay element in response to the first control signal.

11. The semiconductor memory device of claim 1, wherein the first internal clock generating unit includes:

a buffer for buffering the delayed clock signal;

a delay element for delaying an output signal of the buffer by the first pulse width; and a logic unit for performing a logic operation of the output signal of the buffer and an output signal of the delay element.

12. The semiconductor memory device of claim 1, wherein the first internal clock generating unit includes:

a transfer gate for transferring the delayed clock signal;

a buffer for inverting an output signal of the transfer gate;

a delay element for delaying an output signal of the buffer; and a logic unit for performing a logic operation of the output signal of the buffer and an output signal of the delay element.

13. The semiconductor memory device of claim 1 further comprising:

a data latch for synchronizing the data from a memory core with the first internal clock signal and the second internal clock signal; and an output driver for driving the data latch to output the data to a DQ pad.

14. The semiconductor memory device of claim 13, wherein the fuse unit includes:

a pull-up device coupled between a power supply terminal and a first node for performing a pull-up operation in response to a ground voltage level;

a first fuse coupled to the first node for generating the first fuse signal; and a second fuse coupled to the first node for generating the second fuse signal.

15. The semiconductor memory device of claim 13, wherein the control signal generating unit includes:

a first control signal generating unit for generating the first control signal, having a first latch unit to perform a latch operation in response to the first fuse signal and a first buffer to buffer an output signal of the first latch unit; and a second control signal generating unit for generating the second control signal, having a second latch unit to perform a latch operation in response to the second fuse signal and a second buffer to buffer an output signal of the second latch unit.

16. The semiconductor memory device of claim 13, wherein the clock signal delaying unit includes:

a first delayer for delaying the external clock signal by a first section in response to the first and second control signals;

a second delayer for delaying the external clock signal by a second section in response to the first control signal; and a logic unit for performing a logic operation of output signals of the first and second delayers.

17. The semiconductor memory device of claim 16, wherein the first delayer includes:

a first logic unit for performing a logic operation of the first and second control signal; and a second logic unit for delaying the external clock signal in response to an output signal of the first logic unit.

18. The semiconductor memory device of claim 16, wherein the second delayer includes:

a delay element for delaying the external clock signal; and a buffer for buffering an output signal of the delay element in response to the first control signal.

19. The semiconductor memory device of claim 13, wherein the first internal clock generating unit includes:

a buffer configured to buffer the delayed clock signal;

a delay element configured to delay an output signal of the buffer by the first pulse width; and a logic unit configured to perform a logic operation of the output signal of the buffer and an output signal of the delay element.

* * * * *